United States Patent
Liao et al.

(10) Patent No.: US 9,484,864 B2
(45) Date of Patent: Nov. 1, 2016

(54) DOHERTY AMPLIFIER

(75) Inventors: Zhongyu Liao, Beijing (CN); Yuanchun Xie, Beijing (CN)

(73) Assignee: TELEFONAKTIEBOLAGET L M ERICSSON, Stockholm (SE)

(*) Notice: Subject to any disclaimer, the term of this patent is extended or adjusted under 35 U.S.C. 154(b) by 9 days.

(21) Appl. No.: 14/407,616

(22) PCT Filed: Jun. 21, 2012

(86) PCT No.: PCT/CN2012/000862
§ 371 (c)(1),
(2), (4) Date: Dec. 12, 2014

(87) PCT Pub. No.: WO2013/188994
PCT Pub. Date: Dec. 27, 2013

(65) Prior Publication Data
US 2015/0130541 A1  May 14, 2015

(51) Int. Cl.
*H03F 1/02* (2006.01)
*H03F 3/21* (2006.01)
*H03F 1/56* (2006.01)
(Continued)

(52) U.S. Cl.
CPC .......... *H03F 1/0288* (2013.01); *H03F 1/565* (2013.01); *H03F 3/21* (2013.01); *H03F 3/245* (2013.01); *H03F 3/602* (2013.01); *H03F 2200/255* (2013.01); *H03F 2200/387* (2013.01); *H03F 2200/543* (2013.01); *H03F 2200/546* (2013.01); *H03F 2203/21139* (2013.01)

(58) Field of Classification Search
CPC ....... H03F 1/0288; H03F 1/07; H03F 1/3252

USPC .............................................. 330/295, 124 R
See application file for complete search history.

(56) References Cited

U.S. PATENT DOCUMENTS

| | | | |
|---|---|---|---|
| 7,336,125 B2* | 2/2008 | Kyu | H03F 1/0288 330/124 R |
| 8,314,654 B2* | 11/2012 | Outaleb | H03F 1/0288 330/124 R |
| 8,576,010 B2* | 11/2013 | Yanduru | H03F 1/0288 330/124 R |

(Continued)

FOREIGN PATENT DOCUMENTS

| | | |
|---|---|---|
| CN | 101783652 | 7/2010 |
| CN | 102355198 | 2/2012 |

OTHER PUBLICATIONS

PCT International Search Report for International application No. PCT/CN2012/000862, Feb. 7, 2013.

*Primary Examiner* — Henry Choe
(74) *Attorney, Agent, or Firm* — Patents on Demand, P.A.; Brian K. Buchheit; Scott M. Garrett

(57) ABSTRACT

A Doherty amplifier (300) is provided, it comprises: a main amplifier (301) and a peak amplifier (302); a first microstrip (303) with λ/4 electric length connected between the main amplifier and the peak amplifier; a second microstrip (304) with λ/4 electric length connected between a junction of outputs of the peak amplifier and the main amplifier, and an output terminal (306); at least a tuner (305) for adjusting radius of VSWR circle of the main amplifier and connected, in series with the first microstrip (303), between the main amplifier (301) and the peak amplifier (302) based on input signal power. The hack-off power level efficiency is increased by enlarge the VSWR radius with the new Doherty structure.

17 Claims, 4 Drawing Sheets

(51) Int. Cl.
 *H03F 3/24* (2006.01)
 *H03F 3/60* (2006.01)

(56) References Cited

U.S. PATENT DOCUMENTS

| | | | |
|---|---|---|---|
| 8,717,099 B2 * | 5/2014 | Wilson | H03F 1/0288 330/124 R |
| 8,717,102 B2 * | 5/2014 | Wilson | H03F 3/193 330/124 R |
| 2007/0008032 A1 | 1/2007 | Kyu et al. | |
| 2008/0284509 A1 | 11/2008 | Kim et al. | |
| 2010/0244949 A1 * | 9/2010 | Gustavsson | H03F 1/0288 330/124 R |
| 2015/0091667 A1 * | 4/2015 | Seneviratne | H01P 5/02 333/35 |

* cited by examiner

DOHERTY AMPLIFIER

PRIORITY

This nonprovisional application is a U.S. National Stage Filing under 35 U.S.C. §371 of International Patent Application Serial No. PCT/CN2012/000862, filed Jun. 21, 2012, and entitled "Doherty Amplifier."

TECHNICAL FIELD

The invention generally relates to power amplifier technologies, particularly to a Doherty amplifier applied in communication systems, such as in wireless base stations.

BACKGROUND

As well known, the Doherty structure is a mainstream in current power amplifier (PA) design in base stations. High peak power and high efficiency in back-off power level makes the Doherty amplifier an ideal way for power saving.

Currently technology on PA design is using Doherty structure to meet linearity and efficiency requirement. As shown in FIG. 1, the conventional Doherty amplifier includes two amplifier stages, a main amplifier and a peak amplifier. The main amplifier is an amplifier that primarily amplifies the average power of the input signal. The peak amplifier is an amplifier that continuously amplifies the input signal when the main amplifier is saturated. The main amplifier is connected to the output through an impedance-inverter, usually a quarter wavelength transmission line or an equivalent lumped network. To compensate the quarter wavelength transmission line, a quarter wavelength is added to the input of peak amplifier.

The Doherty amplifier generally operates in two condition, small signal and high signal. During small signal period, only the main amplifier is active and the peak amplifier does not work. The impedance Zp in FIG. 1 is infinite in theory. Two microstrips ZmT and ZcT make the main amplifier load Zm much higher than 50 Ohm, and thus the main amplifier performs with high efficiency. During high signal period, the peak amplifier works and the main amplifier load Zm normally turns to 50 Ohm. The two amplifiers' peak power will combine.

Although Doherty structure can maintain high efficiency at back-off power level, the back-off Voltage Standing Wave Ratio (VSWR) of the main amplifier is determined by the hardware, such as the characteristic impedances of the two microstrips ZmT and ZcT, etc. Thus, in a conventional Doherty amplifier structure, the impedance with the best back-off efficiency is not on the VSWR circle of the main amplifier.

Since the distance (VSWR) between high power at 50 ohm and high efficiency at high impedance load of main transistor is defined by transistor itself, it is often difficult to find a suitable peak transistor to fit the distance. Therefore, it is difficult to get required VSWR to reach maximum efficiency point at high impedance of main transistor.

SUMMARY

Accordingly, the invention seeks to preferably mitigate, alleviate or eliminate one or more of the above mentioned disadvantages singly or in any combination.

To solve one or more of the above problems, this disclosure provides a new Doherty amplifier architecture with enhanced back-off power level efficiency. According to one aspect of the invention, there is provided a Doherty amplifier, including: a main amplifier and a peak amplifier; a first microstrip with $\lambda/4$ electric length connected between the main amplifier and the peak amplifier; a second microstrip with $\lambda/4$ electric length connected between a junction of outputs of the peak amplifier and the main amplifier, and an output terminal; at least a tuner for adjusting radius of VSWR circle of the main amplifier and connected, in series with the first microstrip, between the main amplifier and the peak amplifier based on input signal power.

The at least a tuner includes a third microstrip connected with the first microstrip in series, and a switch unit for controlling the third microstrip as a shunt.

The switch unit includes at least one switch grounded at one end and at least one tunable component connected with the at least one switch.

The third microstrip has a characteristic impedance Z1 and an electric length θ, determined from a distance between the load impedance of the main amplifier at high signal condition at point m1 and a best efficiency point at back-off power level at point m3.

The characteristic impedance Z1 of the third microstrip is different from that of the first microstrip.

The tuner is configured to adjust load impedance Zm of the main amplifier to reach the load impedance of the main amplifier at high signal condition represented by point m1 and the best efficiency point at back-off power level represented by point m3 at small signal condition.

If the distance is larger than a VSWR radius, $ZmT*Zload/ZcT^2$, of the main amplifier, the characteristic impedance Z1 of the third microstrip is taken a value lower than that of the first microstrip, ZmT; if the distance is smaller than the VSWR radius, $ZmT*Zload/ZcT^2$ of the main amplifier, the characteristic impedance Z1 of the third microstrip is taken a value larger than that of the first microstrip, ZmT.

At small signal condition, the switch opens and the third microstrip works; and at high signal condition, the switch closes and the third microstrip is disabled.

The at least one tunable component comprises at least one of a capacitor, an inductor, varactor or PIN diode which is tuned for different frequency channels within whole frequency band.

According to another aspect of the invention, a device containing a Doherty amplifier according to an embodiment of the invention is provided.

This disclosure provides an innovative Doherty structure to boost back-off power level efficiency. The back-off power level efficiency is increased by enlarge the VSWR radius with the new Doherty structure with the tuner, and Radio unit physical size and volume may be decreased. Some devices (such as transistors) not Doherty-friendly could also be used as main transistor by applying the invention. This will increase the transistor candidate pool for main amplifier of the Doherty amplifier.

BRIEF DESCRIPTION OF THE DRAWINGS

The features and advantageous of the present invention will be more apparent from the following exemplary embodiments of the invention illustrated with reference to the accompanied drawings, in which.

DETAILED DESCRIPTION

Embodiments of the invention will be described thoroughly hereinafter with reference to the accompanied drawings. It will be apparent to those skilled in the art that the invention may, however, be embodied in many different forms and should not be construed as limited to the embodiments and specific details set forth herein. Like numbers refer to like elements throughout the description.

In this disclosure, although specific terminologies have been used to exemplify the invention, this should not be seen as limiting the scope of the invention to only the aforementioned communication system, such as wireless base stations. As the rapid development in communications, there will of course also be future type of technologies and systems with which the present invention may be embodied.

In this disclosure, a tuner is adapted for controling radius of VSWR circle of the main amplifier of the Doherty amplifier. When the VSWR is increased, the load impedance of the main amplifier may reach both best efficiency point at back-off power level when the peak amplifier does not work and highest efficiency at 50 Ohm condition at high output power when the peak amplifier works.

Figure 2:
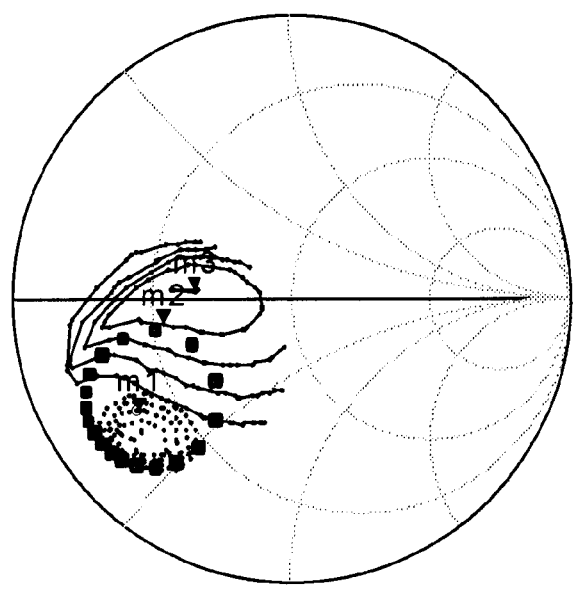
FIG. 2 illustrates a schematic graph of load impedance of the Doherty main amplifier.

FIG. 2 shows a schematic graph of load impedance Zm of the Doherty main amplifier. The circle m2 in FIG. 2 represented with square symbols is the VSWR circle of the main amplifier centered at point m1. Each point on the circle is the load impedance Zm of the main amplifier swept over the electrical length of θ from 0 to 180 degree with a certain step.

During high signal condition, the load impedance Zm of the main amplifier may be expected to match at point m1 (represented with a triangle symbol in FIG. 2) to meet the peak power requirement. Point m1 represents an optimal load impedance Zm for main amplifier to meet peak power requirement at high signal condition. While during the small signal condition, the load impedance Zm of the main amplifier may be expected to change from point m1 to point m3 with the two microstrips ZmT and ZcT to meet high efficiency requirement. Point m3 is an optimal load impedance Zm for main amplifier to reach best drain efficiency at back-off output power level during the small signal condition.

Figure 1:
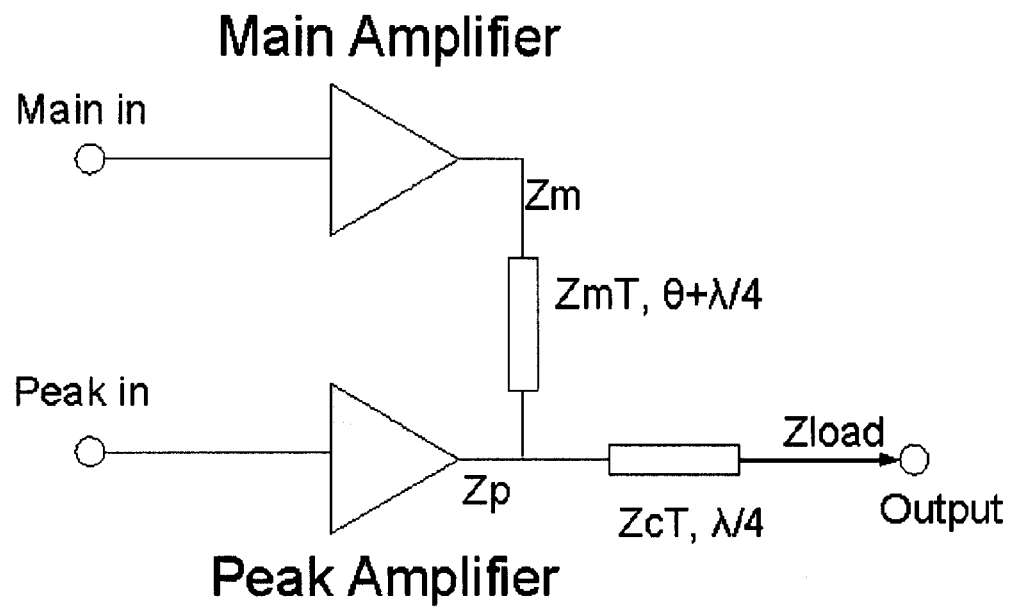
FIG. 1 illustrates a general structural diagram of a Doherty amplifier in prior art.

As the circle radius in FIG. 2 is a function of the characteristic impedances ZmT, ZcT and Zload as shown in FIG. 1, the characteristic impedances ZmT, ZcT and Zload will be fixed when the peak power ratio of the main and peak amplifier is determined, and thus the radius of the VSWR circle will be fixed.

At small signal conditions, if the load impedance of the main amplifier moves to its maximum point, then the whole Doherty PA can provide best efficiency. But in reality, the distance of m1 and m3 does not correspond with the peak power ratio. As shown in the FIG. 2, normally, the distance between point m3 and point m1 is further than the circle radius, the main amplifier can not reach best efficiency as point m3 represents, but can only reach the points on the circle represented as m2. In other words, normally, the radius of the VSWR circle may not reach the best drain efficiency represented by point m3 at back-off output power level.

Figure 3:
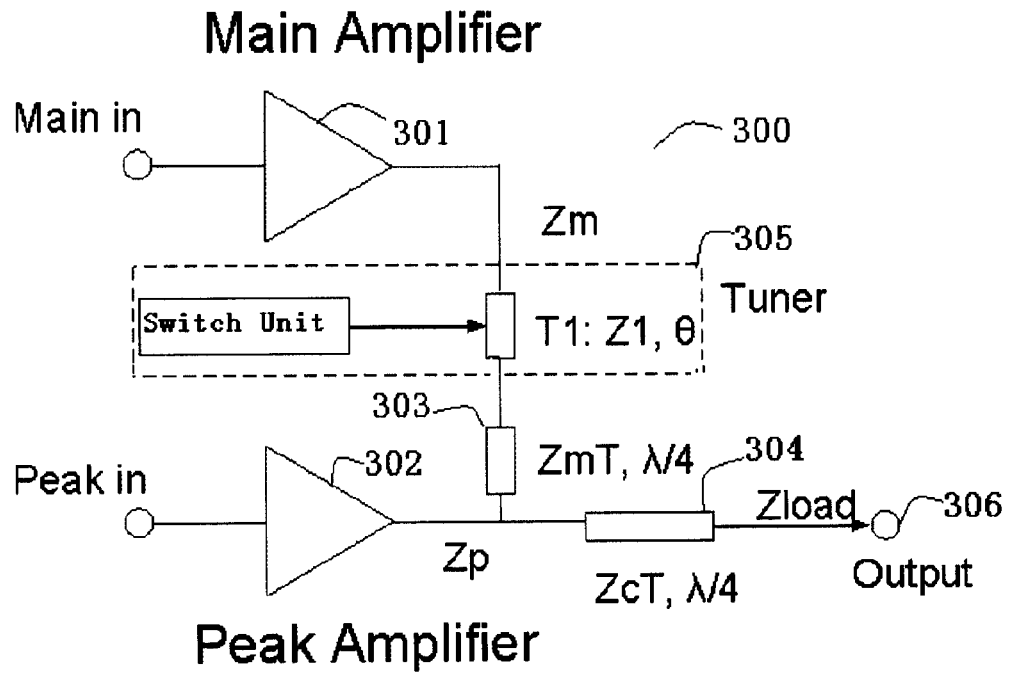
FIG. 3 illustrates a schematic structural diagram of an exemplary Doherty amplifier to boost efficiency according to an embodiment of the present invention.

FIG. 3 illustrates a schematic structural diagram of an exemplary Doherty amplifier 300 to boost efficiency according to an embodiment of the present invention.

In the embodiment, the exemplary Doherty amplifier 300 includes two-way Doherty architecture: a main amplifier 301, a peak amplifier 302, a first microstrip 303 with λ/4 electric length connected between the main amplifier and the peak amplifier; a second microstrip 304 with λ/4 electric length connected between a junction of outputs of the peak amplifier and the main amplifier, and an output terminal 306; and a tuner 305 for adjusting output load impedance of the main amplifier and connected, in series with the first microstrip 303, between the main amplifier 301 and the peak amplifier 302. Particularly, an input signal may be equally divided into two signals. The main amplifier 301 may receive one of the two input signals and amplify the input signal. The peak amplifier 302 may receive the other input signal and amplify it. The output signals of the main amplifier 301 and the peak amplifier 302 are combined at a junction via a λ/4 transmission line (also referred as to microstrip ZmT 303) as shown in FIG. 3. The λ/4 transmission line (also referred as to microstrip ZmT 303) is used as an impedance transformer where λ is the wavelength of the input signal. Another λ/4 transmission line (also referred as to microstrip ZcT 304) is called a Doherty combiner, which converts impedance at combine point to load impedance (normally 50 ohm). The signal output by the Doherty combiner is output via the microstrip ZcT 304 to an output terminal 306. Generally, a λ/4 phase line (which is not shown in FIG. 3 for brief) may work as a phase compensator located in front of the peak amplifier 302. The tuner is connected in series between the microstrip ZmT and the main amplifier 301 for adjusting load impedance of the main amplifier and thus increasing or deceasing the radius of the VSWR circle of the main amplifier.

In an embodiment, the tuner 305 includes a switch unit 402 and a microstrip T1 401 with the characteristic impedance Z1 and electric length θ. The characteristic impedance Z1 of the microstrip T1 401 may be different from that of the microstrip ZmT 303. Further, the characteristic impedance Z1 and the electric length θ of the microstrip T1 401 may be determined according to the distance between point m1 and point m3. To compensate the additional electric length θ, a microstrip line with the same electric length shall also be added to the input of peak amplifier.

Figure 4:
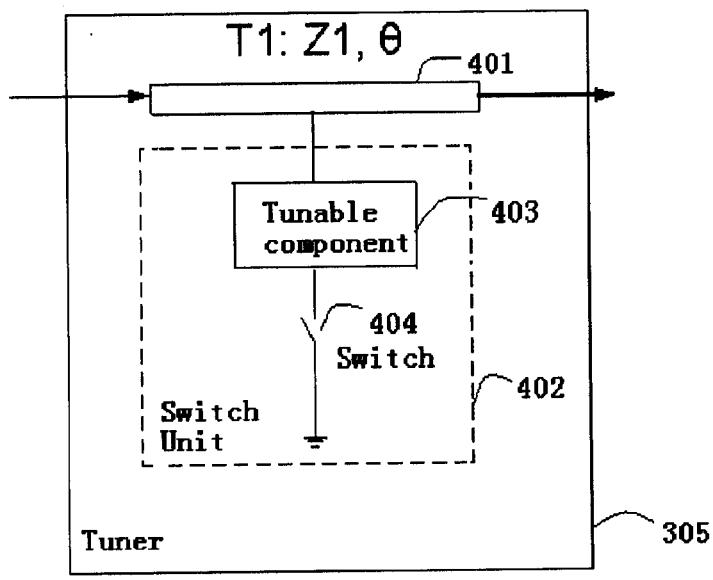
FIG. 4 illustrates a schematic structural diagram of an exemplary tuner applied in the Doherty amplifier according to an embodiment of the present invention.

In an embodiment, the switch unit 402 controlled by the input power signal may be employed to enable or disable the operation of the microstrip T1 305. As an example, the switch unit 402 may include a switch 404 and a tunable component 403 as shown in FIG. 4 where an exemplary tuner 305 applied in the Doherty amplifier is illustrated according to an embodiment of the present invention. The tunable component 403 may be a capacitor, an inductor or other tunable components.

Figure 5:
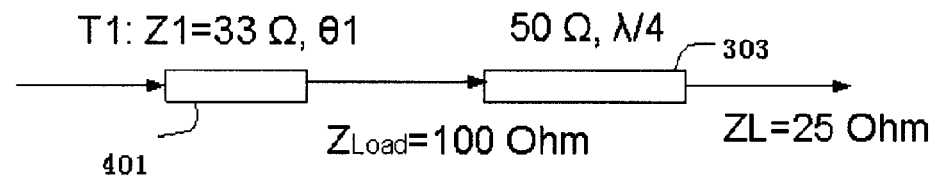
FIG. 5 illustrates a schematic diagram of an equivalent circuit of an exemplary tuner at small signal conditions according to an embodiment of the present invention.

FIG. 5 illustrates a schematic diagram of an equivalent circuit of an exemplary tuner 305 at small signal conditions according to an embodiment of the present invention.

At small signal condition, the switch will open and the microstrip T1 will work. The characteristic impedance Z1 of the microstrip T1 may be designed according to the distance between point m1 and point m3 as shown in FIG. 2. Particularly, the value of Z1 may be adjusted to make point m3 locate substantially on the VSWR circle with the center of point m1 and with the radius of VSWR equals $ZmT^2*Zload/ZcT^2/Z1$ where ZmT represents the characteristic impedance of the microstrip ZmT 303, ZcT represents the characteristic impedance of the microstrip ZcT 304, Zload represents the load impedance of the power amplifier system, Z1 represents the characteristic impedance of the microstrip T1 401.

At small signal condition, if the distance between point m1 and point m3, $ZmT^2*Zload/ZcT^2/Z1$, is too far, or preferably, is larger than the VSWR radius, $ZmT*Zload/ZcT^2$, of the main amplifier 301, i.e., if m3 is outside the VSWR circle with the center of m1 and with the radius of $ZmT*Zload/ZcT^2$, Z1 may be designed lower than ZmT to increase the radius of VSWR circle so as to reach point m3 for highest efficiency at back-off power level. Otherwise, if the distance between point m1 and point m3 is too close, or preferably, is smaller than the VSWR radius, $ZmT*Zload/ZcT^2$, of the main amplifier 301, i.e., if m3 is inside the VSWR circle with the center of m1 and with the radius of $ZmT*Zload/ZcT^2$, Z1 may be designed bigger than ZmT to decrease the radius of the VSWR circle so as to reach point m3 for highest efficiency at back-off power level.

Figure 6:
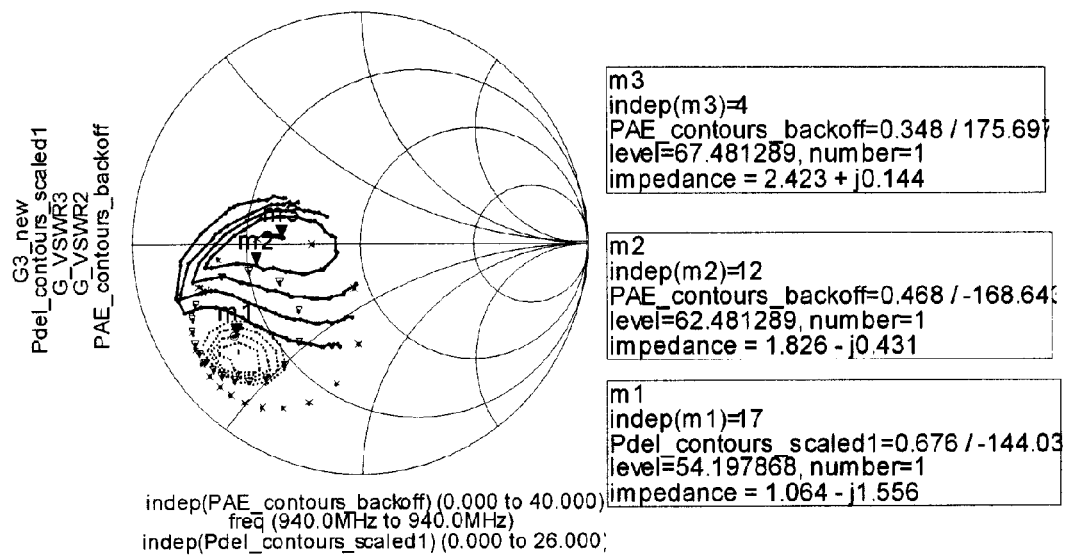
FIG. 6 illustrates a schematic graph of different VSWR contours comparison according to an embodiment of the present invention.
Figure 7:
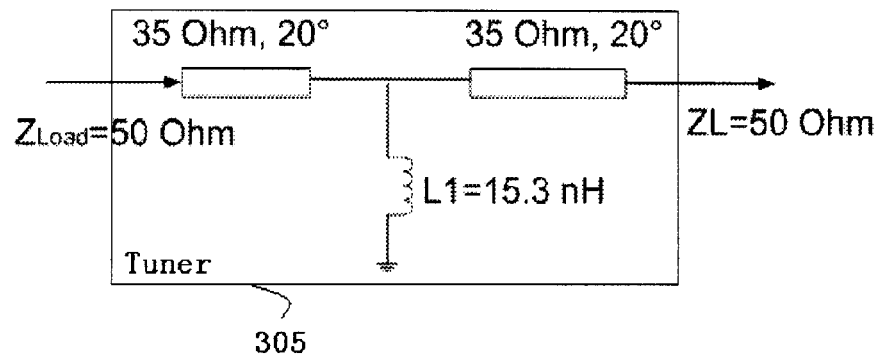
FIG. 7 illustrates a schematic diagram of an equivalent circuit of an exemplary tuner at high signal conditions according to an embodiment of the present invention.

FIG. 6 illustrates a schematic graph of different VSWR contours comparison according to an embodiment of the present invention. Particularly, for Example, if Z1=33 Ohm and Zload=100 Ohm as shown in the FIG. 5, the radius of VSWR circle will be increased from 2 to 3 compared to Z1=50 Ohm. G_VSWR2 is the VSWR circle with the radius value of 2 represented with symbols of triangle which is depicted in case of Z1=50 Ohm and Zload=100 Ohm. It can not reach the best efficiency area for back-off power level, and about 62% efficiency level is achieved as marked in the middle block with m2. G_VSWR3 is the VSWR circle with the radius value of 3 represented with symbols of cross which is depicted in case of Z1=33 Ohm and Zload=100 Ohm. It could reach that the best efficiency area for back-off power level, and about 67% efficiency level may be achieved as marked in the upper block with m3. This could help the main amplifier to gain an extra 5% efficiency at small signal condition, FIG. 7 illustrates a schematic diagram of an equivalent circuit of an exemplary tuner 305 at high signal conditions according to an embodiment of the present invention. At high signal condition, the switch 404 will close and disable the microstrip T1 401. Then output load impedance Zm of the main amplifier is back to 50 Ohm and performs required peak power. An example is given in FIG. 7 to explain how the switch 404 disables the affect of the microstrip T1. As an example, the switch unit 402 includes two components, a switch 404 and an inductor 403. In FIG. 7, the microstrip T1's characteristic impedance Z1 is 35 Ohm and electrical length is 40 degree. If the operation frequency is 1 GHz, and the affect of T1 can be disabled by adding a shunt inductor L1 of 15.3 nH at the center of the microstrip T1.

Figure 8:
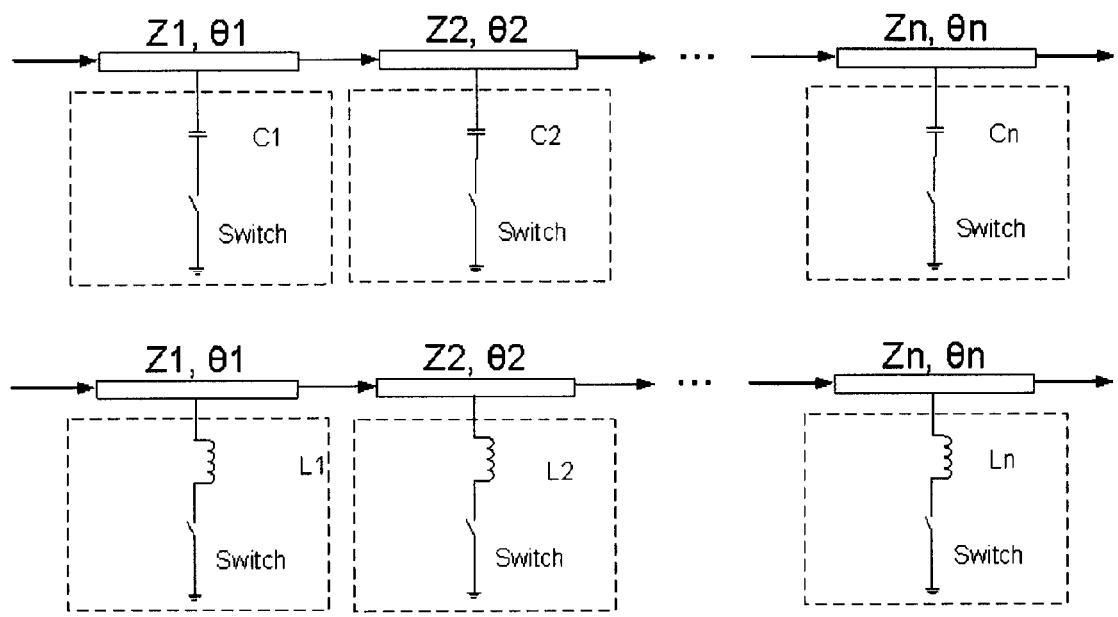
FIG. 8 illustrates a schematic diagram of another exemplary tuner applied in the Doherty amplifier according to an embodiment of the present invention.

FIG. 8 illustrates a schematic diagram of another exemplary tuner applied in the Doherty amplifier according to an embodiment of the present invention. As shown in FIG. 8, the switch unit 402 may not be limited to the form as shown in FIG. 4, it may also have other forms as FIG. 8 shows. As an example, the tuner may include one or more sub-tuners connected in series with each other. Each sub-tuner may include a microstrip and a switch unit. The characteristic impedances Z1, Z2, Zn (n>=2) of the microstrips may be designed to take different or same values, and the electric lengths θ1, θ2, ..., θn (n>=2) may keep the same value or different. The tunable component 403 in FIG. 4 may be a capacitor or an inductor or other tunable components, such as varactor or PIN diode, which may be tuned for different frequency channels to keep optimize efficiency within whole frequency band. Accordingly, a phase tuner may be added to the input of peak amplifier to compensate the phase introduced by the tuner circuit at the output of main amplifier.

In conclusion, in one aspect the characteristic impedance ZmT and ZcT are decided by the peak power ratio between main and peak amplifiers in the theory. In the conventional Doherty structure, the main load VSWR circle radius is only decided by ZmT and ZcT. Thus the radius of the VSWR circle of the main amplifier is a fixed value decided by the peak power ratio between main and peak amplifiers. And in another aspect, the distance between point m1 and m3 are decided by the internal design of the transistor. In another word, the distance between m1 and m3 is another fixed value decided by the transistor itself.

As a result, for the conventional Doherty structure, it is difficult to select a transistor that the fixed radius value of the VSWR circle substantially equals to the distance between point m1 and point m3 while to keep the peak power requirement. Thus in the conventional structure, normally the main amplifier drain efficiency at back-off power level is sacrificed to keep the peak power requirement.

However, a tuner in the disclosure of the present invention may change the main load VSWR circle radius to match the distance between point m1 and m3. Thus the main amplifier load impedance may be converted to reach the best drain efficiency point at the small signal condition while the main amplifier peak power at high signal is not compromised.

It will be appreciated that the above description for clarity has described the embodiments of the invention with reference to different functional units and processors. However, it will be apparent that any suitable distribution of functionality between different functional units or processors may be used without detracting from the invention. For example, functionality illustrated to be performed by separate processors or controllers may be performed by the same processor or controllers. Hence, references to specific functional units are only to be seen as references to suitable means for providing the described functionality rather than indicative of a strict logical or physical structure or organization.

The elements and components of an embodiment of the invention may be physically, functionally and logically implemented in any suitable way. Indeed the functionality may be implemented in a single unit, in a plurality of units or as part of other functional units. As such, the invention may be implemented in a single unit or may be physically and functionally distributed between different units and processors.

It is to be noted that, although individual features may be included in different claims, these may possibly be advantageously combined, and the inclusion in different claims does not imply that a combination of features is not feasible and/or advantageous. Also the inclusion of a feature in one category of claims does not imply a limitation to this category but rather indicates that the feature is equally applicable to other claim categories as appropriate. Further, it is to be noted that, the order of features/steps in the claims or in the description do not imply any specific order in which the features/steps must be worked. Rather, the steps/features may be performed in any suitable order.

The elements and components of an embodiment of the invention may be physically, functionally and logically implemented in any suitable way. Indeed, the functionality may be implemented in a single unit, in a plurality of units or as part of other functional units. As such, the invention may be implemented in a single unit, or may be physically and/or functionally distributed between different units and processors.

The terminology used herein is for the purpose of describing particular embodiments only and is not intended to limit to the invention. As used herein, the singular forms "a", "an" and "the" are intended to comprise the plural forms as well, unless otherwise stated. It will be further understood that the terms "including", "comprising" and conjugation thereof when used herein, specify the presence of stated features, integers, steps, operations, elements, and/or components, but do not preclude the presence or addition of one or more other features, integers, steps, operations, elements, components, and/or groups thereof.

Although the invention has been particularly shown and described with reference to exemplary embodiments thereof, it will be understood by those skilled in the art that various changes in form and details may be made without departing from the spirit and scope of the invention as defined by the appended claims. The exemplary embodiments should be considered in descriptive sense only and not for purposes of limitation. Therefore, the scope of the invention is defined not by the detailed description of the invention but by the appended claims.

The invention claimed is:

1. A Doherty amplifier, comprising:
    a main amplifier and a peak amplifier;
    a first microstrip with lamda/4 electric length connected between the main amplifier and the peak amplifier;
    a second microstrip with lamda/4 electric length connected between a junction of outputs of the peak amplifier and the main amplifier, and an output terminal, wherein in the Doherty amplifier an input signal is divided into a first and a second input signal, wherein the first input signal is received by the main amplifier, which amplifies the first input signal, wherein the second signal is received by the peak amplifier, which amplifies the second input signal, wherein output signals from the main amplifier and the peak amplifier are combined at a junction via the first microstrip, wherein the first microstrip is used as an impedance transformer wherein lamda is a wavelength of a respective input signal at the junction, wherein the second microstrip is a Doherty combiner that converts impedance at a combine point to a load impedance; and
    at least a tuner for adjusting radius of a Voltage Standing Wave Ratio(VSWR) circle of the main amplifier and connected, in series with the first microstrip, between the main amplifier and the peak amplifier.

2. The Doherty amplifier of claim 1, wherein the at least a tuner comprises a third microstrip connected with the first microstrip in series, and a switch unit for controlling the third microstrip as a shunt.

3. The Doherty amplifier of claim 2, wherein the switch unit comprises at least one switch grounded at one end and at least one tunable component connected with the at least one switch.

4. The Doherty amplifier of claim 2, wherein the third microstrip has a characteristic impedance and an electric length, determined from a distance between the load impedance of the main amplifier at high signal condition and a best efficiency point at back-off power level.

5. The Doherty amplifier of claim 4, wherein the characteristic impedance of the third microstrip is different from that of the first microstrip.

6. The Doherty amplifier of claim 1, wherein the tuner is configured to adjust load impedance of the main amplifier to reach the load impedance of the main amplifier at high signal condition and the best efficiency point at back-off power level at small signal condition.

7. The Doherty amplifier of claim 4, wherein if the distance is larger than a VSWR radius, $ZmT*Zload/ZcT^2$, of the main amplifier, the characteristic impedance of the third microstrip is taken a value lower than that of the first microstrip; if the distance is smaller than the VSWR radius, $ZmT*Zload/ZcT^2$, of the main amplifier, the characteristic impedance of the third microstrip is taken a value larger than that of the first microstrip.

8. The Doherty amplifier of claim 3, wherein at small signal condition, the switch opens and the third microstrip works; and at high signal condition, the switch closes and the third microstrip is disabled.

9. The Doherty amplifier of claim 3, wherein the at least one tunable component comprises at least one of a capacitor, an inductor, varactor or PIN diode which is tuned for different frequency channels within whole frequency band.

10. A radio unit comprising:
    a Doherty amplifier comprising:
        a main amplifier and a peak amplifier;
        a first microstrip with lamda/4 electric length connected between the main amplifier and the peak amplifier;
        a second microstrip with lamda/4 electric length connected between a junction of outputs of the peak amplifier and the main amplifier, and an output terminal, wherein in the Doherty amplifier an input signal is divided into a first and a second input signal, wherein the first input signal is received by the main amplifier, which amplifies the first input signal, wherein the second signal is received by the peak amplifier, which amplifies the second input signal, wherein output signals from the main amplifier and the peak amplifier are combined at a junction via the first microstrip, wherein the first microstrip is used as an impedance transformer wherein lamda is a wavelength of a respective input signal at the junction, wherein the second microstrip is a Doherty combiner that converts impedance at a combine point to a load impedance; and
        at least a tuner for adjusting radius of a Voltage Standing Wave Ratio(VSWR) circle of the main amplifier and connected, in series with the first microstrip, between the main amplifier and the peak amplifier.

11. The radio unit of claim 10, wherein the at least a tuner comprises a third microstrip connected with the first microstrip in series, and a switch unit for controlling the third microstrip as a shunt.

12. The radio unit of claim 11, wherein the switch unit comprises at least one switch grounded at one end and at least one tunable component connected with the at least one switch.

13. The radio unit of claim 10, wherein the tuner is configured to adjust load impedance of the main amplifier to reach the load impedance of the main amplifier at high signal condition and the best efficiency point at back-off power level at small signal condition.

14. A wireless base station comprising:
a Doherty amplifier comprising:
   a main amplifier and a peak amplifier;
   a first microstrip with lamda/4 electric length connected between the main amplifier and the peak amplifier;
   a second microstrip with lamda/4 electric length connected between a junction of outputs of the peak amplifier and the main amplifier, and an output terminal, wherein in the Doherty amplifier an input signal is divided into a first and a second input signal, wherein the first input signal is received by the main amplifier, which amplifies the first input signal, wherein the second signal is received by the peak amplifier, which amplifies the second input signal, wherein output signals from the main amplifier and the peak amplifier are combined at a junction via the first microstrip, wherein the first microstrip is used as an impedance transformer wherein lamda is a wavelength of a respective input signal at the junction, wherein the second microstrip is a Doherty combiner that converts impedance at a combine point to a load impedance; and
   at least a tuner for adjusting radius of a Voltage Standing Wave Ratio(VSWR) circle of the main amplifier and connected, in series with the first microstrip, between the main amplifier and the peak amplifier.

15. The wireless base station of claim 14, wherein the at least a tuner comprises a third microstrip connected with the first microstrip in series, and a switch unit for controlling the third microstrip as a shunt.

16. The wireless base station of claim 15, wherein the switch unit comprises at least one switch grounded at one end and at least one tunable component connected with the at least one switch.

17. The wireless base station of claim 14, wherein the tuner is configured to adjust load impedance of the main amplifier to reach the load impedance of the main amplifier at high signal condition and the best efficiency point at back-off power level at small signal condition.

* * * * *